United States Patent
Lin et al.

(10) Patent No.: US 11,189,240 B2
(45) Date of Patent: Nov. 30, 2021

(54) GATE DRIVING CIRCUIT AND DISPLAY PANEL

(71) Applicant: HannStar Display Corporation, Taipei (TW)

(72) Inventors: Sung-Chun Lin, Tainan (TW); Chien-Ting Chan, Tainan (TW)

(73) Assignee: HannStar Display Corporation, Taipei (TW)

( * ) Notice: Subject to any disclaimer, the term of this patent is extended or adjusted under 35 U.S.C. 154(b) by 135 days.

(21) Appl. No.: 16/362,721

(22) Filed: Mar. 25, 2019

(65) Prior Publication Data

US 2019/0304394 A1 Oct. 3, 2019

(30) Foreign Application Priority Data

Mar. 29, 2018 (CN) .......................... 201810269569.6

(51) Int. Cl.
*G09G 3/36* (2006.01)
*G11C 19/28* (2006.01)

(52) U.S. Cl.
CPC ......... *G09G 3/3677* (2013.01); *G11C 19/287* (2013.01); *G09G 2310/0286* (2013.01); *G09G 2310/062* (2013.01)

(58) Field of Classification Search
None
See application file for complete search history.

(56) References Cited

U.S. PATENT DOCUMENTS

| 2002/0041266 A1* | 4/2002 | Koyama | G09G 3/3648 345/87 |
| 2005/0162354 A1* | 7/2005 | Osame | G09G 3/3258 345/76 |
| 2008/0203311 A1* | 8/2008 | Watanabe | H01L 27/14658 250/370.08 |
| 2013/0043495 A1* | 2/2013 | Ogasawara | G09G 3/3677 257/88 |
| 2015/0009105 A1* | 1/2015 | Nomura | G09G 3/3283 345/76 |

(Continued)

FOREIGN PATENT DOCUMENTS

| CN | 1868003 A | 11/2006 |
| CN | 103280176 A | 9/2013 |

(Continued)

*Primary Examiner* — Benjamin C Lee
*Assistant Examiner* — Emily J Frank
(74) *Attorney, Agent, or Firm* — CKC & Partners Co., LLC

(57) ABSTRACT

A gate driving circuit is provided, which includes shift registers and a reset signal line. The shift registers respectively provide scan signals to gate lines of a display panel. Each shift register includes a precharge unit and pull-up unit. The precharge unit is coupled to a first node and outputs a precharge signal through the first node. The pull-up unit is coupled to the first node and the second node and outputs one of the scan signals to a corresponding one of the gate lines through the second node. The reset signal line is coupled to the shift registers and provides a reset signal to the shift registers. The reset signal is used to reset the shift registers after the shift registers respectively output the scan signals. The reset signal line is arranged between a layout area of the precharge unit and a layout area of the pull-up unit.

7 Claims, 9 Drawing Sheets

(56) References Cited

U.S. PATENT DOCUMENTS

| | | | |
|---|---|---|---|
| 2015/0340102 A1* | 11/2015 | Qian | G11C 27/04 |
| | | | 377/54 |
| 2016/0012911 A1 | 1/2016 | Han et al. | |
| 2016/0225462 A1 | 8/2016 | Harada | |
| 2016/0247478 A1* | 8/2016 | Ishige | G09G 3/3677 |
| 2016/0321995 A1* | 11/2016 | Shin | H01L 27/3276 |
| 2017/0018244 A1* | 1/2017 | Jen | G11C 19/287 |
| 2019/0391436 A1* | 12/2019 | Yoshida | H03K 17/687 |

FOREIGN PATENT DOCUMENTS

| | | |
|---|---|---|
| CN | 104900211 A | 9/2015 |
| CN | 105895046 A | 8/2016 |
| CN | 106251820 A | 12/2016 |
| CN | 106328084 A | 1/2017 |
| CN | 106340273 A | 1/2017 |
| CN | 106504720 A | 3/2017 |
| CN | 107689213 A | 2/2018 |
| WO | 2010146751 A1 | 12/2010 |

* cited by examiner

GATE DRIVING CIRCUIT AND DISPLAY PANEL

RELATED APPLICATIONS

This application claims priority to Chinese Application Serial Number 201810269569.6 filed Mar. 29, 2018, which is herein incorporated by reference.

BACKGROUND

Field of Invention

The present invention relates to a gate driving circuit and a display panel, and more particularly to a gate driving circuit and a display panel that has the gate driving circuit.

Description of Related Art

With the advance of development of thin film transistor (TFT) liquid crystal display, technologies of integrating a driving circuit (e.g. a gate driving circuit) on a display panel, such as a system on glass (SOG) technology, have been widely applied to conventional display devices, thereby minimizing and improving the size and performance of the display devices. On the other hand, in order to prevent shift registers of a gate driving circuit from being affected by noise interferences and outputting abnormal scan signals, the shift registers have voltage-level reset functions, in which node voltages are reset at the end of each frame period, so as to ensure that the display panel displays have correct images in the next frame period. However, the voltage-level reset functions of the shift registers require additional circuits, which are disadvantageous to narrow border requirements of a display panel.

SUMMARY

An objective of the invention is to provide a gate driving circuit which has a voltage-level reset function. Elements and wirings for providing the voltage-level reset function are arranged within shift registers of the gate driving circuit, so as to reduce a layout area of the gate driving circuit. A display panel with such gate driving circuit can realize its narrow border requirements.

One aspect of the invention is directed to a gate driving circuit which includes plural shift registers and a reset signal line. The shift registers are configured to respectively provide scan signals to gate lines of a display panel. Each shift register includes a precharge unit, a pull-up unit and a reset signal line. The precharge unit is coupled to a first node and is configured to output a precharge signal through the first node. The pull-up unit is coupled to the first node and a second node and is configured to output one of the scan signals to a corresponding one of the gate lines through the second node. The reset signal line is coupled to the shift registers and is configured to provide a reset signal to the shift registers, in which the reset signal is used to reset the shift registers after the shift registers respectively output the scan signals. The reset signal line is arranged between a layout area of the precharge unit and a layout area of the pull-up unit.

In one embodiment of the invention, each shift register further includes a reset unit. The reset unit is coupled to the first node, the second node and the reset signal line, in which the reset unit resets voltage levels of the first node and the second node based on the reset signal.

In one embodiment of the invention, the reset signal line is arranged between the layout area of the precharge unit and a layout area of the reset unit.

In one embodiment of the invention, the reset signal line is arranged between a layout area of the reset unit and the layout area of the pull-up unit.

In one embodiment of the invention, the reset unit includes a first transistor and a second transistor. A gate of the first transistor is a first portion of the reset signal line, a first source or drain of the first transistor is coupled to a reference voltage level, and a second source or drain of the first transistor is coupled to the first node. A gate of the second transistor is a second portion of the reset signal line, a first source or drain of the second transistor is coupled to the reference voltage level, and a second source or drain of the second transistor is coupled to the second node.

In one embodiment of the invention, the reset unit includes a first transistor and a second transistor. A gate of the first transistor is coupled to the reset signal line, a first source or drain of the first transistor is coupled to a reference voltage level, and a second source or drain of the first transistor is coupled to the first node. A gate of the second transistor is coupled to the reset signal line, a first source or drain of the second transistor is coupled to the reference voltage level, and a second source or drain of the second transistor is coupled to the second node.

In one embodiment of the invention, the pull-up unit includes a third transistor and a capacitor. A gate of the third transistor is coupled to the first node and is configured to receive the precharge signal, a first source or drain of the third transistor is configured to receive a clock signal, and a second source or drain of the third transistor is coupled to the second node and is configured to output one of the scan signals. A first terminal of the capacitor is coupled to the gate of the third transistor, and a second terminal of the capacitor is coupled to the second source or drain of the third transistor.

In one embodiment of the invention, the precharge unit includes a fourth transistor and a fifth transistor. A gate of the fourth transistor is configured to receive a first input signal, a first source or drain of the fourth transistor is configured to receive a forward input signal, and a second source or drain of the fourth transistor is coupled to the first node and is configured to output the precharge signal. A gate of the fifth transistor is configured to receive a second input signal, a first source or drain of the fifth transistor is configured to receive a backward input signal, and a second source or drain of the fifth transistor is coupled second source or drain of the fourth transistor.

In one embodiment of the invention, each shift register further includes a pull-down unit. The pull-down unit is coupled to the first node and the second node and is configured to receive the precharge signal, a first pull-down control signal and a second pull-down control signal and control whether to pull down one of the scan signals at a reference voltage level and then keep one of the scan signals at the reference voltage level based on the precharge signal, the first pull-down control signal and the second pull-down control signal. The reset signal line is arranged between the layout area of the precharge unit and a layout area of the pull-down unit.

In one embodiment of the invention, the pull-down unit includes a sixth transistor, a seventh transistor, an eighth transistor, a ninth transistor and a tenth transistor. A gate and a first source or drain of the sixth transistor is configured to input the first pull-down control signal. A gate of the seventh transistor is configured to input the second pull-down control signal, a first source or drain of the seventh transistor is coupled to the reference voltage level, and a second source or drain of the seventh transistor is coupled to a second source or drain of the sixth transistor. A gate of the eighth transistor is coupled to the first node, a first source or drain of the eighth transistor is coupled to the reference voltage level, and a second source or drain of the eighth transistor is coupled to the second source or drain of the sixth transistor. A gate of the ninth transistor is coupled to the second source or drain of the eighth transistor, a first source or drain of the ninth transistor is coupled to the reference voltage level, and a second source or drain of the ninth transistor is coupled to the first node. A gate of the tenth transistor is coupled to the second source or drain of the eighth transistor, a first source or drain of the tenth transistor is coupled to the reference voltage level, and a second source or drain of the tenth transistor is coupled to the second node.

Another aspect of the invention is directed to a display panel which has a display area and a non-display area and includes a substrate, plural gate lines, plural data lines, plural shift registers and a reset signal line. The gate lines and the data lines are disposed on the substrate. The shift registers are disposed on the substrate and in the non-display area and are configured to respectively provide scan signals to the gate lines. Each shift register includes a precharge unit and a pull-up unit. The precharge unit is coupled to a first node and is configured to output a precharge signal through the first node. The pull-up unit is coupled to the first node and a second node and is configured to output one of the scan signals to a corresponding one of the gate lines through the second node. The reset signal line is disposed on the substrate and in the non-display area, in which the reset signal line is configured to provide a reset signal to the shift registers, the reset signal is used to reset the shift registers before the shift registers respectively output the scan signals, and the reset signal line crosses a layout area of each shift register. The reset signal line is arranged between a layout area of the precharge unit and a layout area of the pull-up unit.

In one embodiment of the invention, each shift register further includes a reset unit. The reset unit is coupled to the first node, the second node and the reset signal line and resets voltage levels of the first node and the second node based on the reset signal.

In one embodiment of the invention, the reset signal line is arranged between the layout area of the precharge unit and a layout area of the reset unit.

In one embodiment of the invention, the reset signal line is arranged between a layout area of the reset unit and the layout area of the pull-up unit.

In one embodiment of the invention, the reset unit includes a first transistor and a second transistor. A gate of the first transistor is a first portion of the reset signal line, a first source or drain of the first transistor is coupled to a reference voltage level, and a second source or drain of the first transistor is coupled to the first node. A gate of the second transistor is a second portion of the reset signal line, a first source or drain of the second transistor is coupled to the reference voltage level, and a second source or drain of the second transistor is coupled to the second node.

In one embodiment of the invention, the reset unit includes a first transistor and a second transistor. A gate of the first transistor is coupled to the reset signal line, a first source or drain of the first transistor is coupled to a reference voltage level, and a second source or drain of the first transistor is coupled to the first node. A gate of the second transistor is coupled to the reset signal line, a first source or drain of the second transistor is coupled to the reference voltage level, and a second source or drain of the second transistor is coupled to the reference voltage level, and a second source or drain of the second transistor is coupled to the second node.

In one embodiment of the invention, each shift register includes a pull-down unit. The pull-down unit is coupled to the first node and the second node and is configured to receive the precharge signal, a first pull-down control signal and a second pull-down control signal and is configured to control whether to pull down the scan signal at a reference voltage level and then keep the scan signal at the reference voltage level based on the precharge signal, the first pull-down control signal and the second pull-down control signal. The reset signal line is arranged between the layout area of the precharge unit and a layout area of the pull-down unit.

In comparison with the conventional are, the gate driving circuit of the invention has voltage-level reset function, and elements and wirings for providing the voltage-level reset function are arranged within the shift registers thereof, and therefore the layout area of the gate driving circuit is reduced. A display panel with such gate driving circuit fabricated therein can realize its narrow border requirements.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

It will be understood that, although the terms "first," "second," and "third" may be used herein to describe various elements, components, areas, layers and/or portions, these elements, components, areas, layers and/or portions, should not be limited by these terms. These terms are only used to distinguish elements, components, areas, layers and/or portions.

In the following description, the term "coupled" may be used to indicate that two or more elements are in direct physical or electrical contact with each other, or may also mean that two or more elements may not be in direct contact with each other. "Coupled" may still be used to indicate that two or more elements cooperate or interact with each other.

Figure 1:
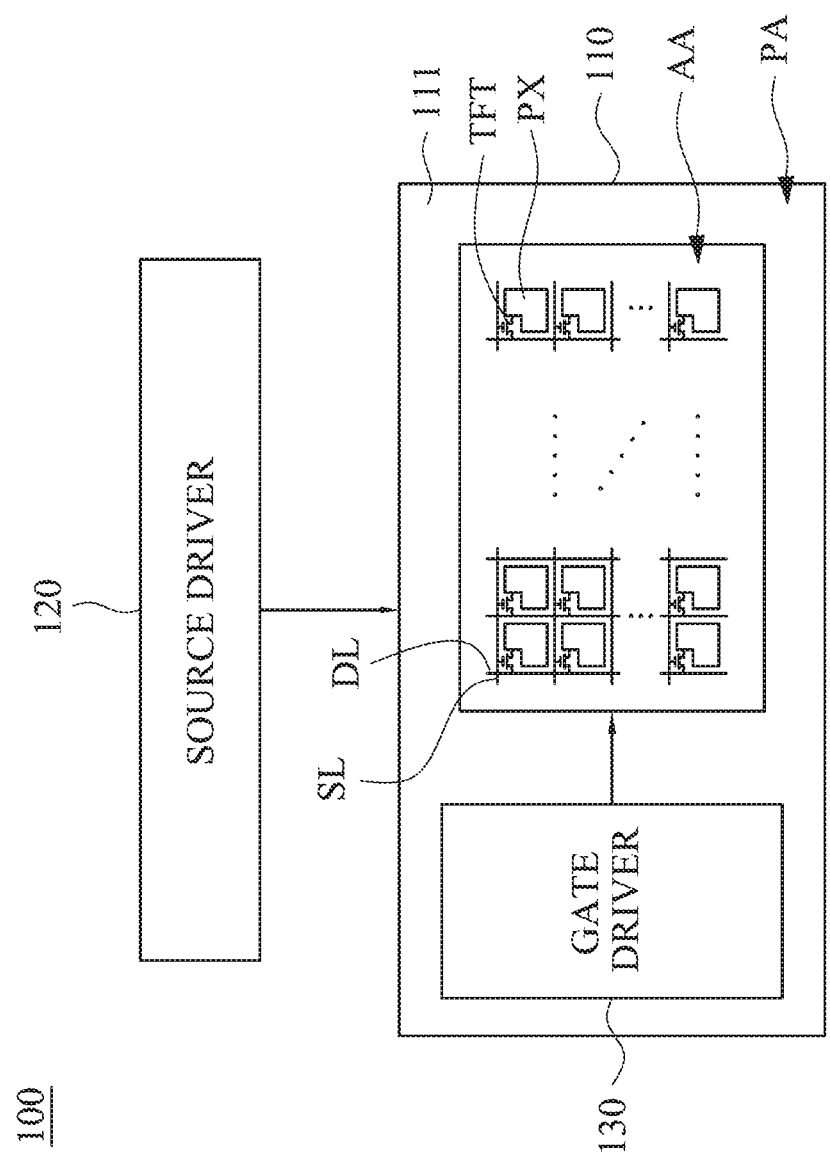
FIG. 1 is a schematic diagram of a display device in accordance with some embodiments of the invention.

Referring to FIG. 1, FIG. 1 is a schematic diagram of a display device 100 in accordance with some embodiments of the invention. The display device 100 includes a display panel 110, a source driver 120 and a gate driver 130. The display panel 110 may be, for example, a liquid crystal display (LCD) apparatus of twisted nematic (TN) mode, in-plane switching (IPS) mode, fringe-field switching (FFS) mode, vertical alignment (VA) mode or other different modes, or an organic light-emitting diode (OLED) panel. The source driver 120 is electrically connected to the display panel 110 and is configured to convert image data into source driving signals and transmit the source driving signals to the display panel 110. The gate driver 130 is configured to generate and transmit gate driving signals to the display panel 110. The display panel 110 has an active area AA and a peripheral area PA. In the active area AA, data lines DL, gate lines SL and pixels PX are formed on a lower substrate 111, and these pixels PX collectively display an image by the driving of the source driving signals and the gate driving signals. In the peripheral area PA, wirings (not shown) are respectively coupled to the source driver 120 and the gate driver 130 and are respectively coupled to the data lines DL and the gate lines SL in the active area AA, so as to respectively send the source driving signals and the gate driving signals to thin film transistors TFT of the corresponding pixels PX and on the lower substrate 111, such that the pixels PX display corresponding gray levels in a particular time under the on-off switch control of the thin film transistors TFT.

The display device 100 of the invention may be a system on glass (SOG) panel. In other words, in the invention, the gate driver 130 is formed in the display panel 110. As such, the electrical components in the display panel 110, in the source driver 120 and in the gate driver 130 may be formed simultaneously by the same process or processes. For example, the TFTs in the gate driver 130 and in the active area AA of the display panel 110 may be formed simultaneously by the same process or processes. In other embodiments, the source driver 120 may also be formed in the peripheral area PA of the display panel 110, and the electrical components and wirings in the display panel 110, the source driver 120 and the gate driver 130 may be formed simultaneously by the same process or processes.

Figure 2:
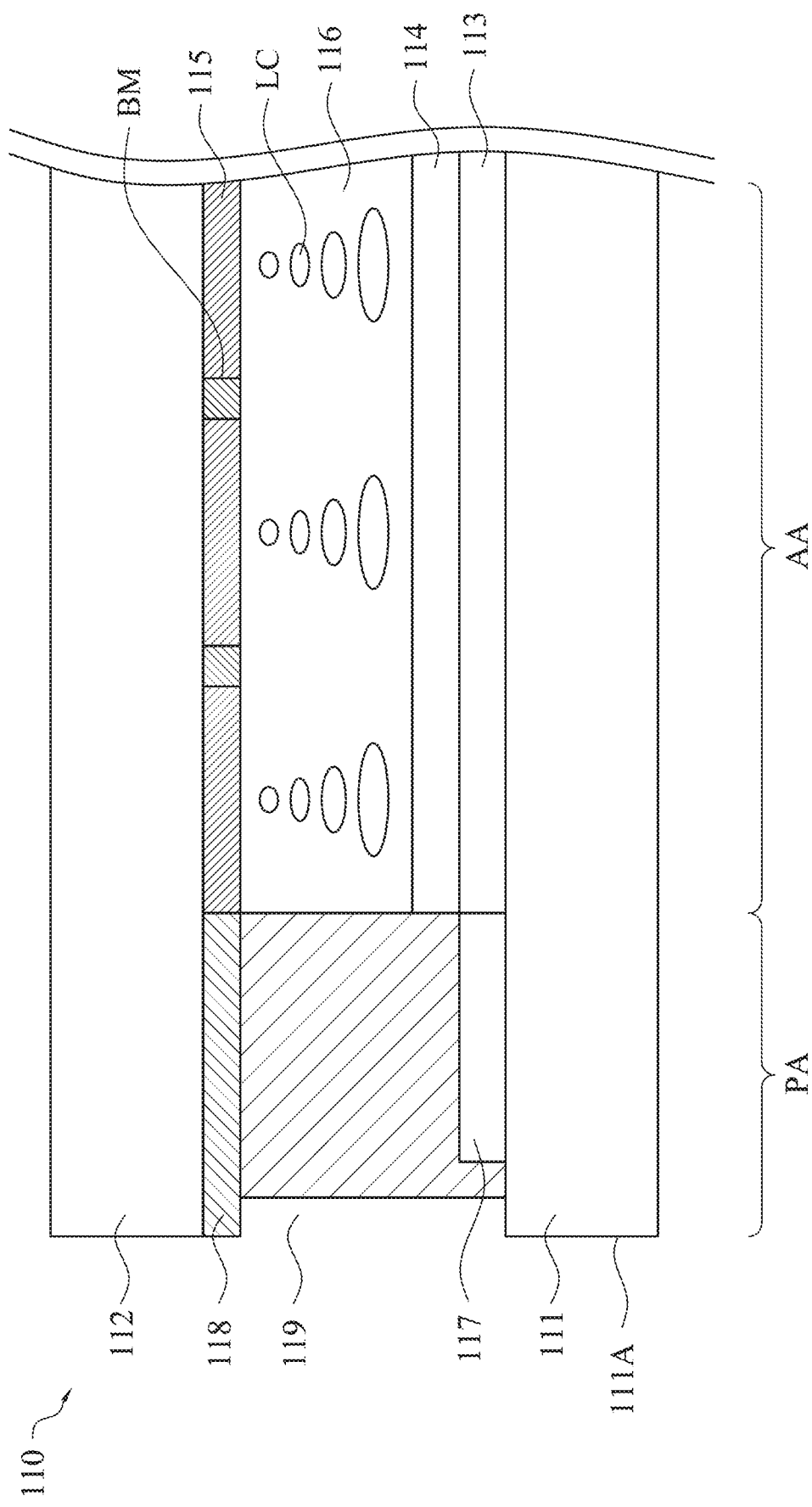
FIG. 2 is a partial cross sectional view of the display panel in FIG. 1.

FIG. 2 is a partial cross sectional view of the display panel 110 in FIG. 1. In FIG. 2, the display panel 110 includes the lower substrate 111 (or called a TFT substrate) and an upper substrate 112 (or called a color filter substrate) and includes the active area AA and the peripheral area PA. In the active area AA of the display panel 110, an active device layer 113 and a pixel electrode layer 114 are disposed on the lower substrate 111, a color filter layer 115 and a black matrix BM are disposed on the upper substrate 112, and a liquid crystal layer 116 is disposed between the pixel electrode layer 114 and the color filter layer 115. The liquid crystal layer 116 includes liquid crystal molecules LC which are correspondingly twisted or rotated by the internal electric field of the display panel 110. The display panel 110 further includes a common electrode layer (not shown) in the interior thereof and configured to interact with the pixel electrode layer 114 to generate an electric field, such that the liquid crystal molecules LC of the liquid crystal layer 116 are correspondingly twisted or rotated by the electric field. For each pixel PX, the active device layer 113 includes a thin film transistor TFT coupled to the pixel electrode layer 114. The voltage level of the pixel electrode layer 114 may be changed by controlling the switch status of the thin film transistor TFT, so as to change the strength distribution of the internal electrical field. The common electrode layer (not shown) may be disposed at different positions based on the type of the display panel. For illustration, if the display panel 110 is a TN type LCD panel or a VA type LCD panel, the common electrode layer (not shown) and the pixel electrode layer 114 are respectively disposed at two opposite sides of the liquid crystal layer 116; if the display panel 110 is an IPS display panel or an FFS display panel, the common electrode layer (not shown) and the pixel electrode layer 114 are at the same side of the liquid crystal layer 116.

In the peripheral area PA of the display panel 110, a driving circuit 117 is disposed on the lower substrate 111, a shielding layer 118 is disposed on the upper substrate 112, and a sealant 119 is disposed between the driving circuit 117 and the shielding layer 118 and extends from an edge 111A of the lower substrate 111 toward the active area AA. The sealant 119 may be cured through illumination by light to bond the lower substrate 111 and the upper substrate 112. The driving circuit 117 may be the source driver 120 or the gate driver 130 in FIG. 1 or any other driving circuit that can be disposed on the lower substrate 111. The shielding layer 118 is used to reflect light for curing the sealant 119 and to prevent the light from penetrating to the upper substrate 112, so as to enhance the curing effect of the sealant 119. In addition, in another embodiment of the invention, the material of the shielding layer 118 may be the same as that of the black matrix BM. In some embodiments, the shielding layer 118 is a part of the black matrix BM. It is noted that although FIG. 2 shows that the sealant 119 completely covers the driving circuit 117, the invention is not limited thereto; the sealant 119 may cover only a portion of the driving circuit 117.

Figure 3:
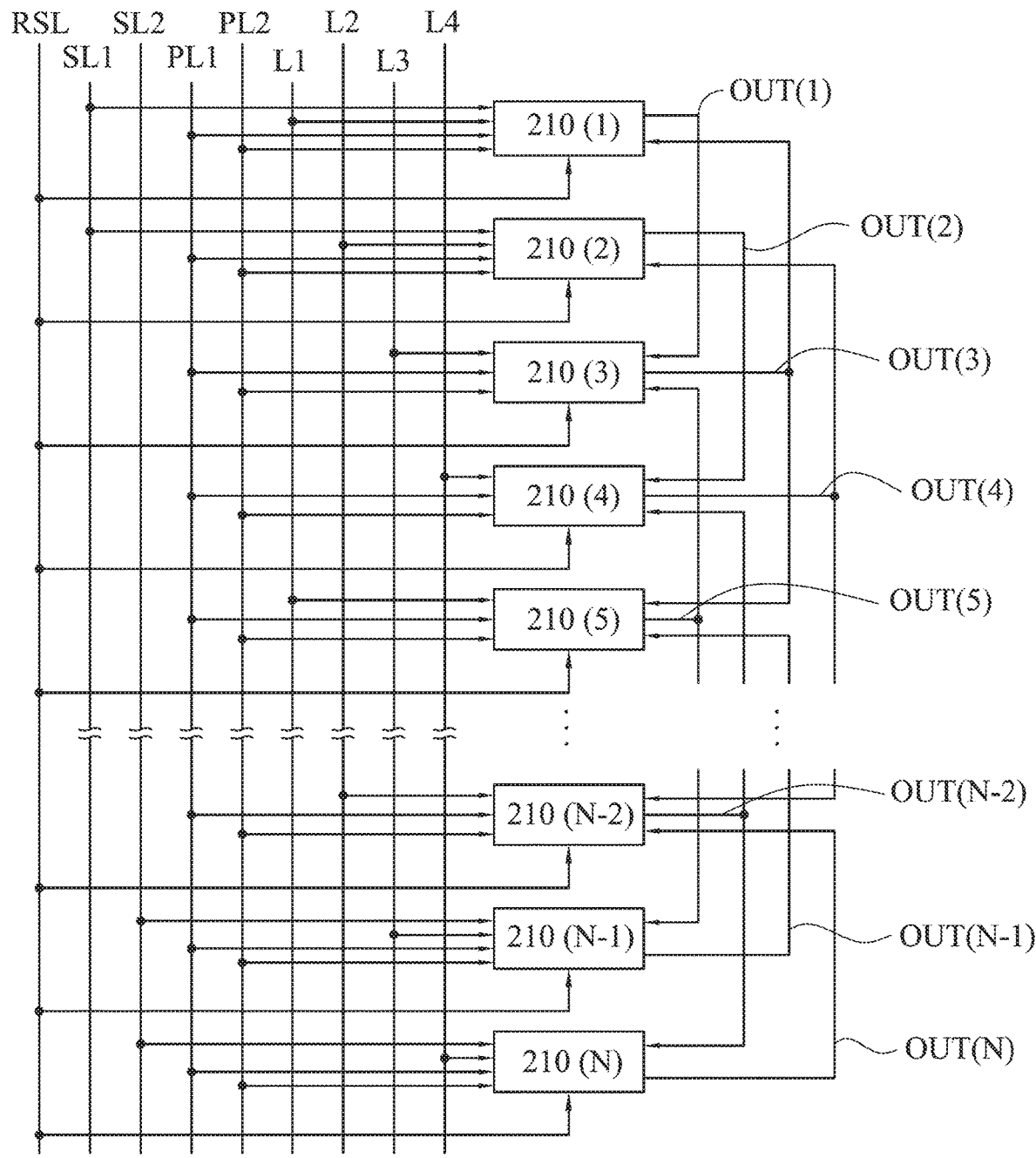
FIG. 3 is a schematic diagram of a gate driving circuit in accordance with some embodiments of the invention.

Referring to FIG. 3, which is a schematic diagram of a gate driving circuit 200 in accordance with some embodiments of the invention. The gate driving circuit 200 may be applied to the display device 100 of FIG. 1 or another similar display device. In the following, the gate driving circuit 200 applied to the display device 100 of FIG. 1 is exemplified for description. The gate driving circuit 200 is a part of the gate driver 130, and includes clock signal lines L1-L4, a starting signal line SL1, an ending signal line SL2, control signal lines PL1 and PL2, a reset signal line RSL and N stage shift registers 210(1)-210(N), where N is an integer greater than or equal to 5. In some embodiments, N is a multiple of 4. In FIG. 3, the clock signals lines L1-L4 respectively provide the clock signals C1-C4 to the corresponding shift registers 210(1)-210(N). In addition, the starting signal line SL1 provides a starting signal STV1 to the $1^{st}$ and $2^{nd}$ stage shift registers 210(1) and 210(2), the ending signal line SL2 provides an ending signal STV2 to the $(N-1)^{th}$ and $N^{th}$ stage shift registers 210(N-1) and 210(N), and the control signal lines PL1 and PL2 and the reset signal line RSL respectively provide pull-down control signals GPW1 and GPW2 and a reset signal RST to all of the shift registers 210(1)-210(N). The clock signal lines L1-L4, the starting signal line SL1, the ending signal line SL2 and the reset signal line RSL may be coupled to one or more chips. That is, the clock signals C1-C4, the starting signal STV1, the ending signal STV2 and the reset signal RST may be provided by one or more chip(s), such as a timing controller chip or a driving circuit, but are not limited thereto.

The $1^{st}$ to $N^{th}$ stage shift registers 210(1)-210(N) respectively provide $1^{st}$ to $N^{th}$ stage scan signals OUT(1)-OUT(N) to the corresponding gate lines SL. The $1^{st}$ and $2^{nd}$ stage scan signals OUT(1) and OUT(2) are respectively inputted to the $3^{rd}$ and $4^{th}$ stage shift registers 210(3) and 210(4), the $(N-1)^{th}$ and $N^{th}$ scan signals OUT(N-1) and OUT(N) are respectively inputted to the $(N-3)^{th}$ and $(N-2)^{th}$ stage shift registers 210(N-3) and 210(N-2), and each of the $3^{rd}$ to $(N-2)^{th}$ stage scan signals OUT(3)-OUT(N-2) is inputted to the shift registers previous two stage of shift register thereto and next two stage of shift register thereto. For illustration, the $3^{rd}$ stage scan signal OUT(3) is inputted to the $1^{st}$ and $5^{th}$ shift registers 210(1) and 210(5).

Figure 4:
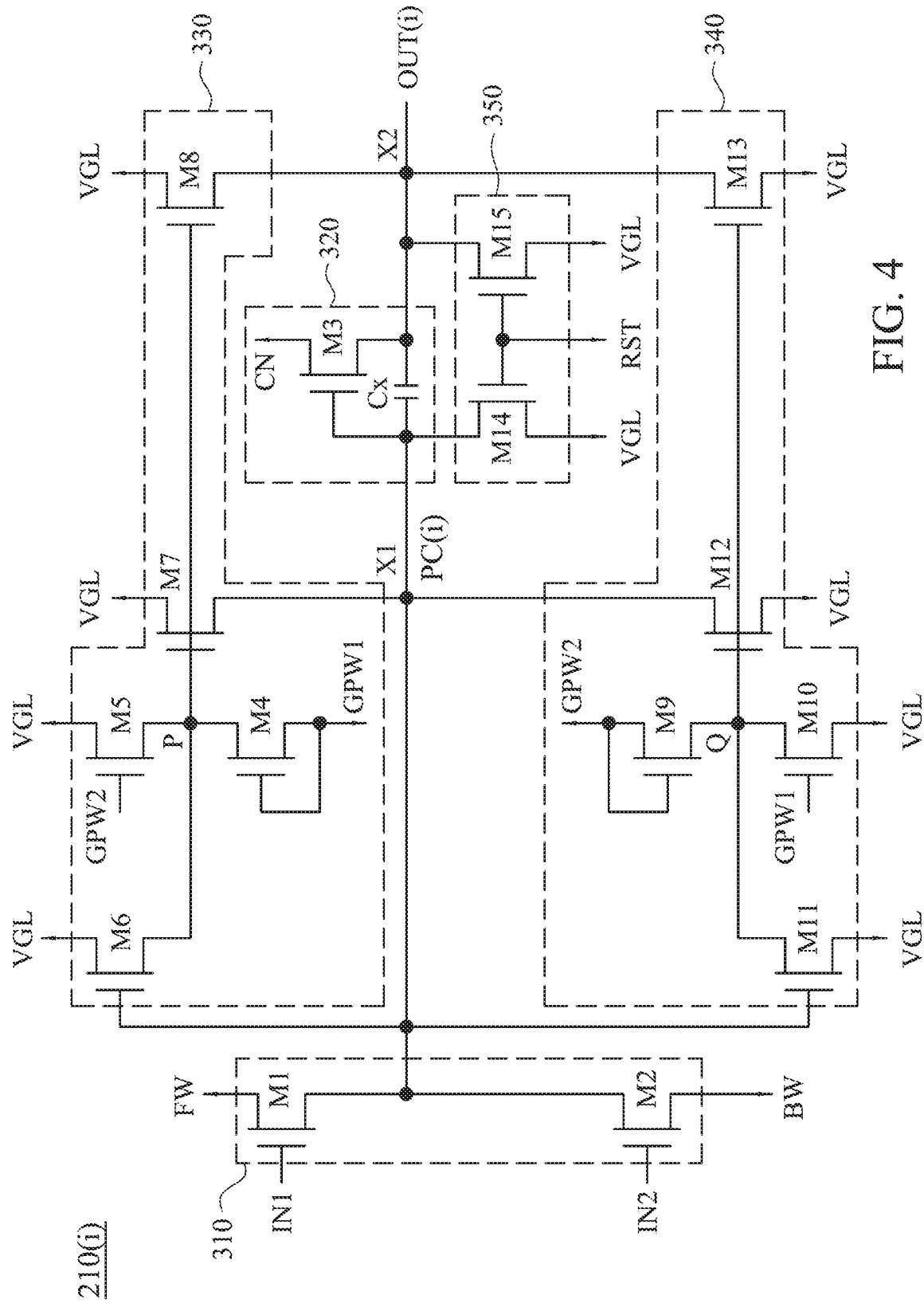
FIG. 4 illustrates an equivalent circuit diagram in accordance with the stage shift register of the gate driving circuit in FIG. 3.

FIG. 4 illustrates an equivalent circuit diagram in accordance with the $i^{th}$ stage shift register 210(i) of the gate driving circuit 200 in FIG. 3, where i is an integer from 1 to N. The $i^{th}$ stage shift register 210(i) includes a precharge unit 310, a pull-up unit 320, a first pull-down unit 330, a second pull-down unit 340 and a reset unit 350.

The precharge unit 310 receives input signals IN1 and IN2 to output the precharge signal PC(i) through the node X1 based on the input signals IN1 and IN2. The precharge unit 310 includes transistors M1 and M2. In the embodiments, the gate driving circuit 200 is a driving circuit of bidirectional scanning; in the $i^{th}$ shift register 210(i), the gate of the transistor M1 receives the input signal IN1, the first source or drain the transistor M1 receives a forward input signal FW, and the second source or drain of the transistor M1 is coupled to the node X1, the gate of the transistor M2 receive the input signal IN2, the first source or drain of the transistor M2 receives a backward input signal BW, and the second source or drain of the transistor M2 is coupled to the node X1. In the embodiments, the first source or drain and the second source or drain for each transistor may be a source and a drain of the transistor, respectively, or alternatively a drain and a source of the transistor, respectively.

If the shift register 210(i) is the $1^{st}$ stage shift register 210(1) or the $2^{nd}$ stage shift register 210(2) (i.e. i is 1 or 2), the input signal IN1 is the starting signal STV1, and the input signal IN2 is the scan signal OUT(i+2) outputted by the $(i+2)^{th}$ stage shift register 210(i+2) (i.e. the $3^{rd}$ stage scan signal OUT(3) or the $4^{th}$ stage scan signal OUT(4)). If the shift register 210(i) is any one of the $3^{rd}$ stage shift register 210(3) to the $(N-2)^{th}$ stage shift register 210(N-2) (i.e. i is any integer from 3 to N-2), the input signals IN1 and IN2 are respectively the scan signal OUT(i-2) outputted by the $(i-2)^{th}$ stage shift register 210(i-2) and the scan signal OUT(i+2) outputted by the $(i+2)^{th}$ stage shift register 210(i+2). If the shift register 210(i) is the $(N-1)^{th}$ stage shift register 210(N-1) or the $N^{th}$ stage shift register 210(N) (i.e. i is N-1 or N), the input signal IN1 is the scan signal OUT(i-2) outputted by the $(i-2)^{th}$ stage shift register 210(i-2), and the input signal IN2 is the ending signal STV2.

The pull-up unit 320 is coupled to the precharge unit 310 and receives the precharge signal PC(i) and a clock signal CN to output the scan signal OUT(i) through the node X2 based on the precharge signal PC(i) and the clock signal CN, in which the clock signal CN is one of the clock signals C1-C4. In the embodiments in which N is a multiple of 4, if i is 1, 5, . . . or (N-3), the clock signal CN is the clock signal C1; if i is 2, 6, . . . or (N-2), the clock signal CN is the clock signal C2; if i is 3, 7, . . . or (N-1), the clock signal CN is the clock signal C3; if i is 4, 8, . . . or N, the clock signal CN is the clock signal C4. In the embodiments, only the clock signals C1-C4 are exemplified for the clock signal CN, but the invention is not limited thereto.

The pull-up unit 320 includes a transistor M3 and a capacitor Cx. The gate of the transistor M3 is coupled to the node X1, the first source or drain of the transistor M3 receives the clock signal CN, and the second source or drain of the transistor M3 is coupled to the node X2. The two terminals of the capacitor Cx are respectively coupled to the gate and the second source or drain of the transistor M3.

The first pull-down unit 330 is coupled to the precharge unit 310 and the pull-up unit 320 and receives the precharge signal PC(i) and the pull-down control signals GPW1 and GPW2 to control whether to pull down the scan signal OUT(i) to the reference voltage level VGL based on the precharge signal PC(i) and the pull-down control signals GPW1 and GPW2. After pulling down the scan signal OUT(i) to the reference voltage level VGL, the first pull-down unit 330 keeps the scan signal OUT(i) at the reference voltage level VGL.

The first pull-down unit 330 includes transistors M4-M8. The gate and the first source or drain of the transistor M4 receive the pull-down control signal GPW1. The gate of the transistor M5 receives the pull-down control signal GPW2, the first source or drain of the transistor M5 is coupled to the reference voltage level VGL, and the second source or drain of the transistor M5 is coupled to the second source or drain of the transistor M4. The gate of the transistor M6 is coupled to the node X1, the first source or drain of the transistor M6 is coupled to the reference voltage level VGL, and the second source or drain of the transistor M6 is coupled to the second source or drain of the transistor M4. The gate of the transistor M7 is coupled to the second source or drain of the transistor M6, the first source or drain of the transistor M7 receives the reference voltage level VGL, and the second source or drain of the transistor M7 is coupled to the node X1. The gate of the transistor M8 is coupled to the second source or drain of the transistor M6, the first source or drain of the transistor M8 receives the reference voltage level VGL, and the second source or drain of the transistor M8 is coupled to the node X2. When the voltage levels of the pull-down control signals GPW1 and GPW2 are respectively the low voltage level and the high voltage level, the node P is in a low voltage level status. When the voltage levels of the pull-down control signals GPW1 and GPW2 are respectively the high voltage level and the low voltage level, the node P is in a high voltage level status.

The second pull-down unit 340 includes transistors M9-M13. The second pull-down unit 340 is coupled to the precharge unit 310 and the pull-up unit 320 and receives the precharge signal PC(i) and the pull-down control signals GPW1 and GPW2 to control whether to pull down the scan signal OUT(i) to the reference voltage level VGL based on the precharge signal PC(i) and the pull-down control signals GPW1 and GPW2. After pulling down the scan signal OUT(i) to the reference voltage level VGL, the second pull-down unit 340 keeps the scan signal OUT(i) at the reference voltage level VGL.

The gate and the first source or drain of the transistor M9 receive the pull-down control signal GPW2. The gate of the transistor M10 receives the pull-down control signal GPW1, the first source or drain of the transistor M10 is coupled to the reference voltage level VGL, and the second source or drain of the transistor M10 is coupled to the second source or drain of the transistor M9. The gate of the transistor M11 is coupled to the node X1, the first source or drain of the transistor M11 is coupled to the reference voltage level VGL, and the second source or drain of the transistor M11 is coupled to the second source or drain of the transistor M9. The gate of the transistor M12 is coupled to the second source or drain of the transistor M11, the first source or drain of the transistor M12 receives the reference voltage level VGL, and the second source or drain of the transistor M12 is coupled to the node X1. The gate of the transistor M13 is coupled to the second source or drain of the transistor M11, the first source or drain of the transistor M13 receives the reference voltage level VGL, and the second source or drain of the transistor M13 is coupled to the node X2. When the voltage levels of the pull-down control signals GPW1 and GPW2 are respectively the low voltage level and the high voltage level, the node Q is in a high voltage level status. When the voltage levels of the pull-down control signals GPW1 and GPW2 are respectively the high voltage level and the low voltage level, the node Q is in a low voltage level status.

The reset unit 350 is coupled to the nodes X1 and X2 and resets the voltage levels of the nodes X1 and X2 (i.e. resets the precharge signal PC(i) and the scan signal OUT(i)) based on the reset signal RST after sequentially scanning the gate lines SL of the display panel 110 in each frame period. That is, after outputting the last stage scan signal (the $N^{th}$ stage scan signal OUT(N) in the embodiments) in each frame period, the voltage levels of the nodes X1 and X2 are set to be low voltage levels. In some embodiments, the reset unit 350 further resets the voltage levels of the nodes X1 and X2 before the display panel 110 switches from a non-display status to a display status. The reset unit 350 includes transistors M14 and M15. The gate of the transistor M14 receive the reset signal RST, the first source or drain of the transistor M14 is coupled to the reference voltage level, and the second source or drain of the transistors M14 is coupled to the node X1. The gate of the transistor M15 receive the reset signal RST, the first source or drain of the transistor M15 is coupled to the reference voltage level, and the second source or drain of the transistors M15 is coupled to the node X2.

Figure 5:
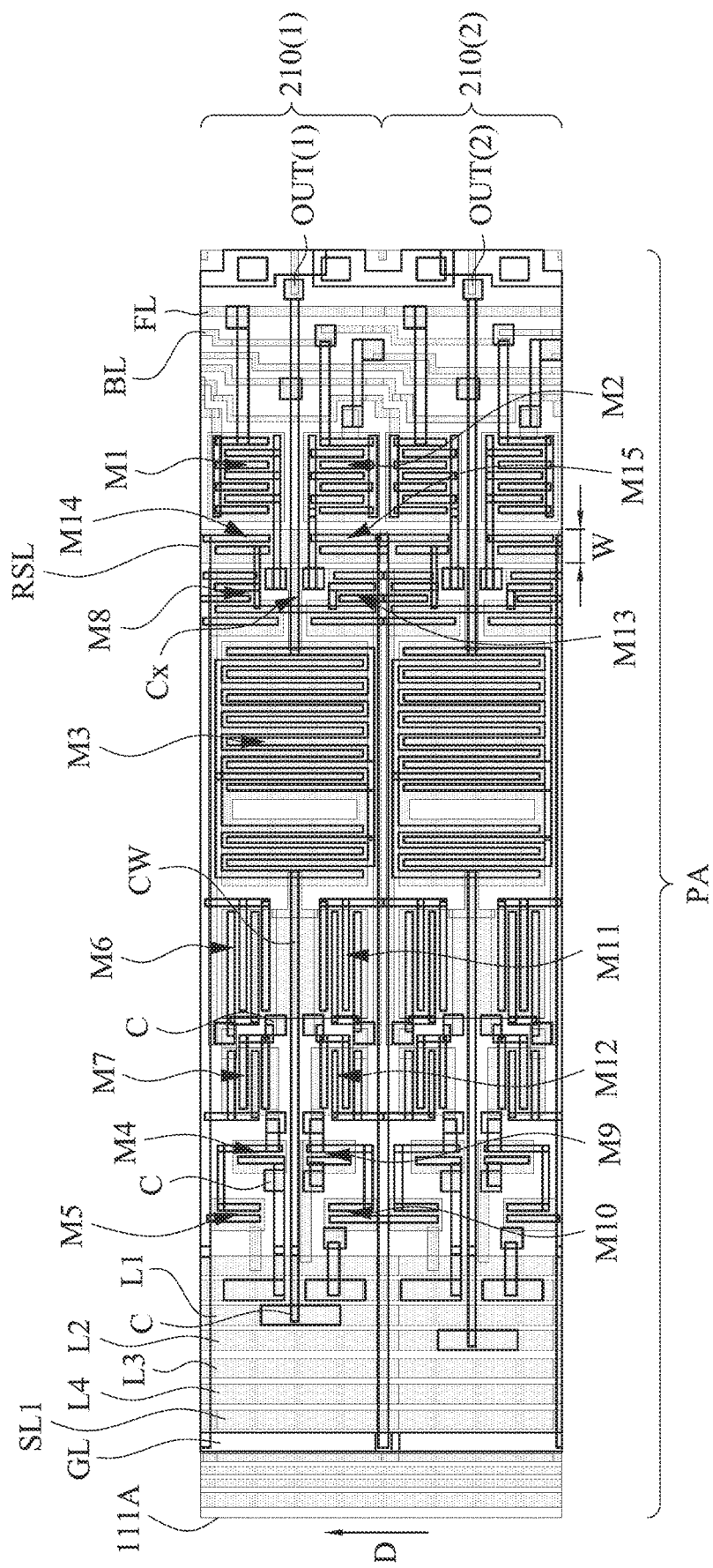
FIG. 5 is circuit layout diagram of the shift register in FIG. 3.

The layout relating to the shift registers 210(1)-210(N) and related signal wirings in the gate driver 130 are exemplified as follows. Referring to FIG. 5, FIG. 5 is a layout diagram of shift registers and signal wirings in accordance with some embodiments of the invention. For convenience of description, FIG. 5 only illustrates the $1^{st}$ and $2^{nd}$ stage shift registers 210(1) and 210(2). However, those having ordinary skill in the art shall be able to directly derive the layout manner of the other shift registers 210(3)-210(N) from the layout diagram of FIG. 5 the contents of FIGS. 3 and 4. In FIG. 5, signal wirings such as the ground line GL (which provides the voltage reference level VGL), the starting signal line SL1, the control signal lines PL1 and PL2 and the clock signal lines L1-L4 are near the edge 111A of the lower substrate 111 and extend along the direction D, while the forward signal line FL, the backward signal line BL and the output terminals of the $1^{st}$ and $2^{nd}$ stage shift registers 210(1) and 210(2) (which respectively output the scan signals OUT(1) and OUT(2)) are near the active area AA.

As shown in FIG. 5, each of the layout areas of the $1^{st}$ and $2^{nd}$ stage shift registers 210(1) and 210(2) includes the transistors M1-M15 and the capacitor Cx (which is formed from the wirings respective coupled to the gate and the second source or drain of the transistor M3) and is positioned between some signal wirings (which include the ground line GL, the starting signal line SL1, the ending signal line SL2, the control signal lines PL1 and PL2 and the clock signal lines L1-L4, in which the ending signal line SL2 is not shown in FIG. 5) and the output terminals of the shift registers 210(1) and 210(2). The transistors M1 and M2 are arranged in the layout area of the precharge unit 310, the transistor M3 and the capacitor Cx are arranged in the layout area of the pull-up unit 320, the transistors M4-M8 are arranged in the layout area of the first pull-down unit 330, the transistors M9-M13 are arranged in the layout area of the second pull-down unit 340, and the transistors M14 and M15 are arranged in the layout area of the reset unit 350. The reset signal line RSL extends along the direction D and penetrate through the $1^{st}$ and $2^{nd}$ stage shift registers 210(1) and 210(2). In the $1^{st}$ and $2^{nd}$ stage shift registers 210(1) and 210(2), the reset signal line RSL is arranged between the layout area of the precharge unit 310 (including the transistors M1 and M2) and the layout area of the pull-up unit 320 (including the transistor M3 and the capacitor Cx). Furthermore, in other embodiments, the layout areas of the pull-up unit 320, the first pull-down unit 330 (including the transistors M4-M8) and the second pull-down unit 340 (including the transistors M9-M13) may be further arranged at the same side of the reset signal line RSL.

Figure 6A:
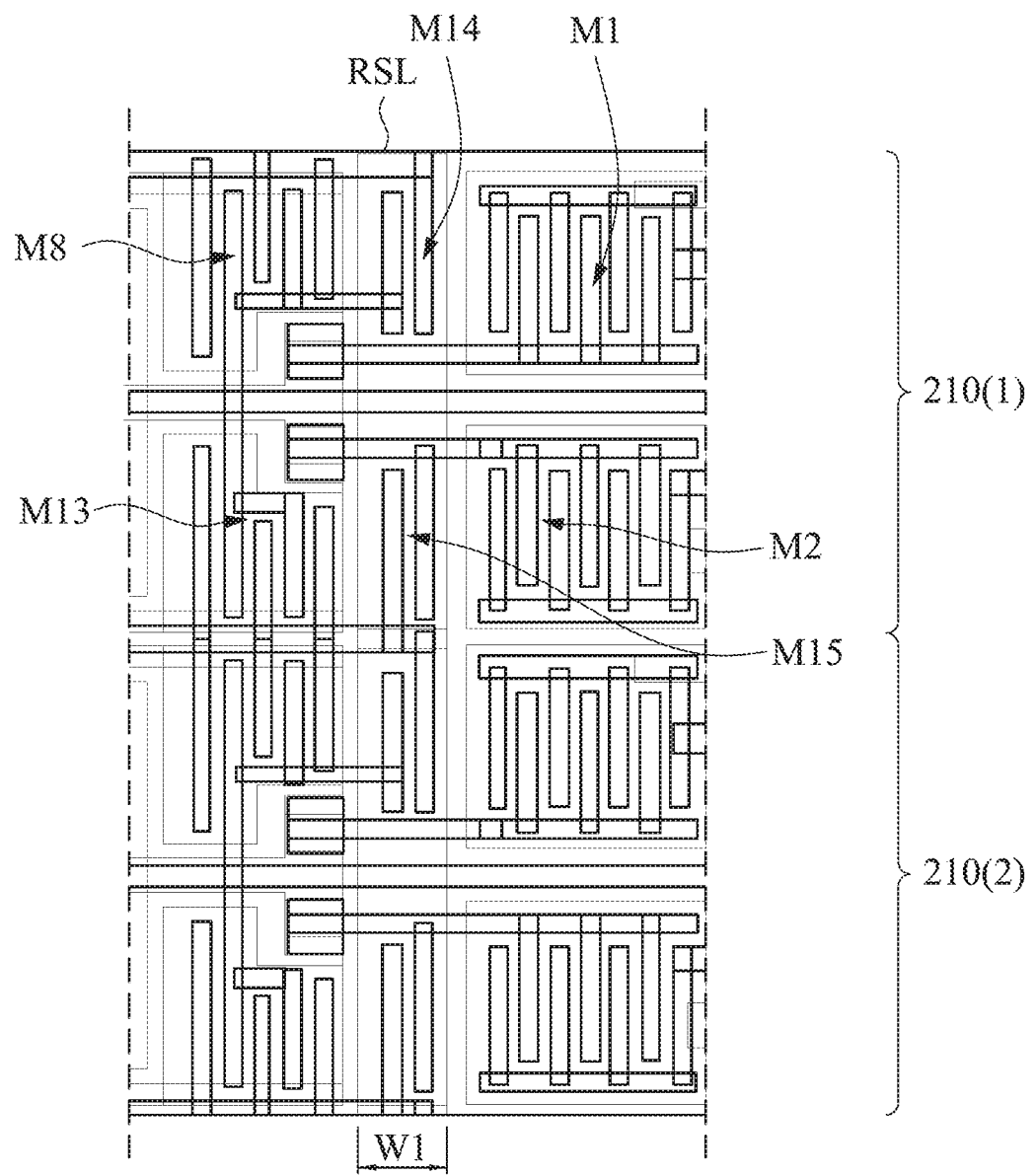
FIG. 6A is a locally enlarged view of the circuit layout in FIG. 5.

In some embodiments, as shown in FIG. 5 and FIG. 6A, the reset signal line RSL is overlapped with the layout area of the reset unit 350 (including the transistors M14 and M15). Further, two portions of the reset signal line RSL are respectively used as the gates of the transistors M14 and M15, and therefore the layout area of the reset signal line RSL is the layout area of the reset unit 350. As such, the layout areas of the pull-up unit 320, the first pull-down unit 330 and the second pull-down unit 340 are at the same side of the layout area of the reset unit 350, while the precharge unit 310 is at the other side of the layout area of the reset unit 350.

Figure 6B:
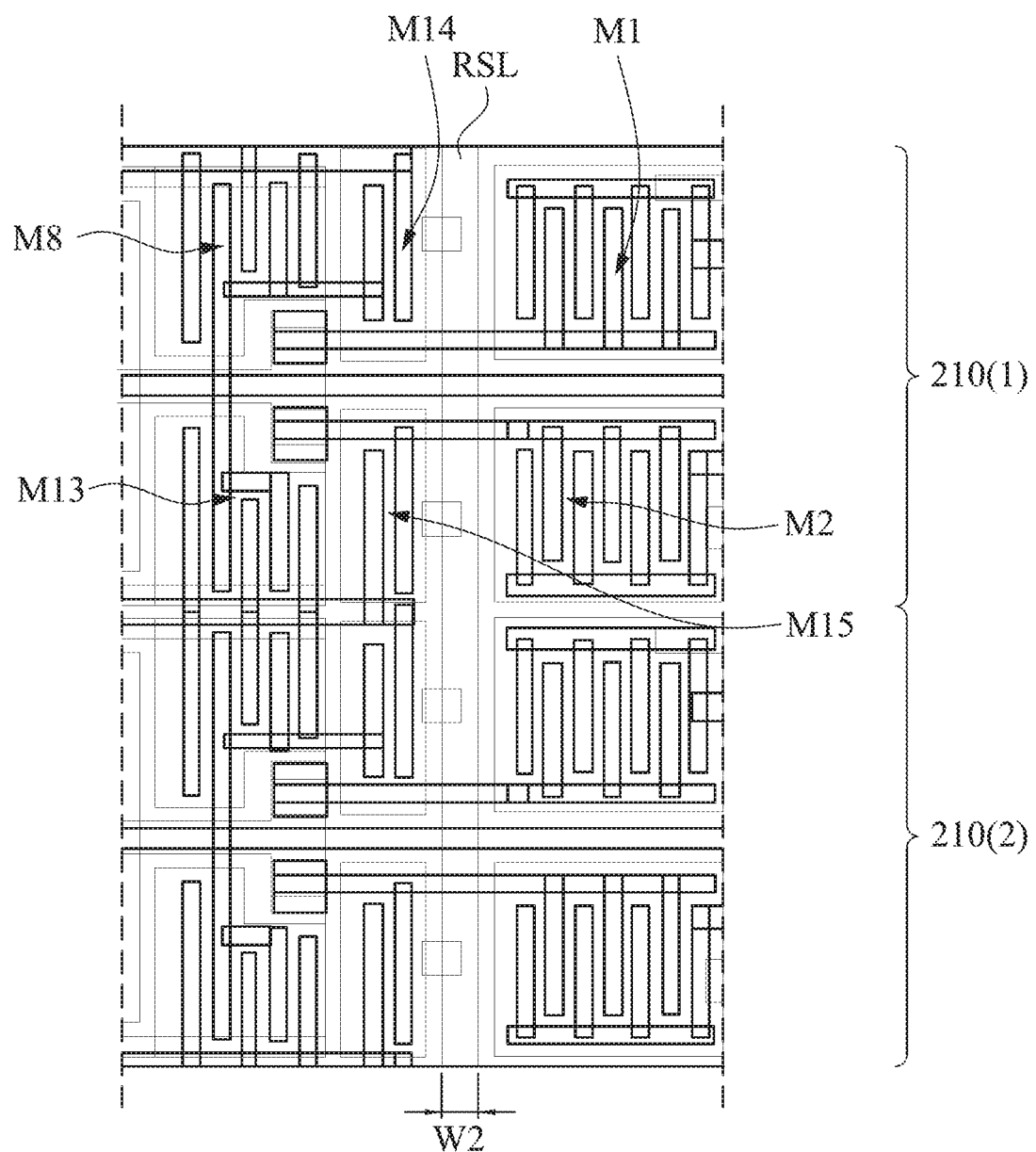
FIG. 6B is a locally enlarged view of a circuit layout of a shift register in accordance with another embodiment of the invention.

In other embodiments, as shown in FIG. 6B, the reset signal lint RSL is non-overlapped with the layout area of the reset unit 350 (including the transistors M14 and M15). The reset signal line RSL may be arranged between the layout areas of the precharge unit 310 and the reset unit 350, i.e., the layout areas of the pull-up unit 320, the first pull-down unit 330 and the second pull-down unit 340 are at the same side of the layout area of the reset unit 350, while the precharge unit 310 and the reset signal line RSL are at the other side of the layout area of the reset unit 350. Alternatively, the reset signal line RSL may be arranged between the layout areas of the reset unit 350 and the pull-up unit 320, i.e., the pull-up unit 320, the first pull-down unit 330, the second pull-down unit 340 and the layout area of the reset signal line RSL are all at the same side of the layout area of the reset unit 350, while the precharge unit 310 is at the other side of the layout area of the reset unit 350. In some embodiments, the reset signal line RSL and the gates the transistors M14 and M15 are formed in the same process.

The width of the reset signal line RSL may be determined in accordance with its arrangement position or the design requirements of the transistors M14 and M15. The width of the reset signal line RSL is relevant to whether the reset signal line RSL is overlapped with the transistors M14 and M15 in the direction D. As shown in FIG. 6A, the reset signal line RSL has a width W1 when being overlapped with the transistors M14 and M15, while as shown in FIG. 6B, the reset signal line RSL has a width W2 when being non-overlapped with the transistors M14 and M15, in which the width W1 is greater than the width W2.

Moreover, the layout diagram shown in FIG. 5 further includes multiple connecting structures C. The connecting structures C are on the lower substrate 111 and in the peripheral area PA and are used as media for connecting elements that belong to different metal layers. These connecting structures C may include the connecting structures at the connection points of signal wirings and connecting wirings (e.g. the connecting structure at the connection point of the clock signal line L1 and the connecting wiring CW connected to the first source or drain of the transistor M3), the connecting structure at the connection point of the gate and the first or second source or drain of the same transistor (e.g. the connection point for connecting the gate and the first source or drain of the transistor M4), the connecting structure at the connection point of different transistors (e.g. the connecting structure at the connection point for connecting the second source or drain of the transistor M6 and the gate of the transistor M7) and the connecting structure at any connection point for connecting elements that belong to different metal layers.

Figure 7:
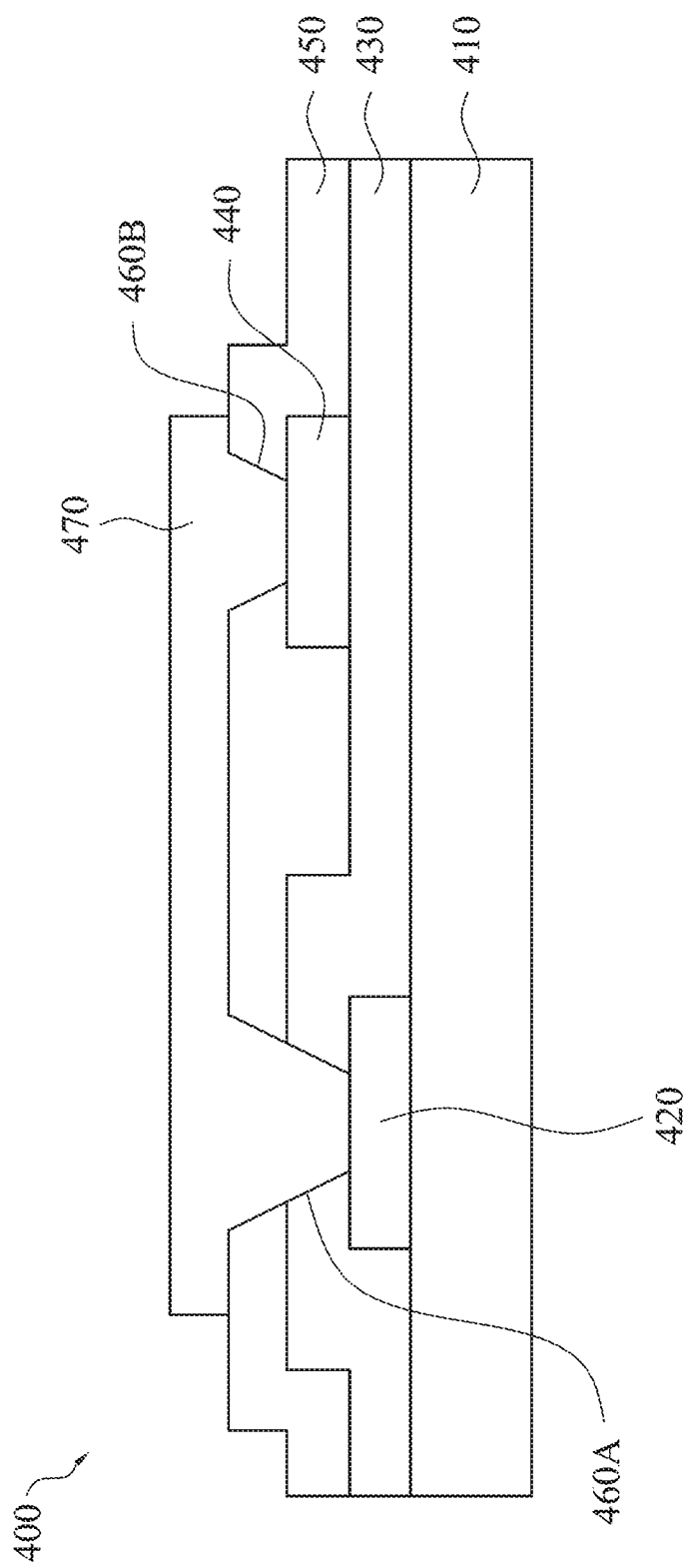
FIG. 7 is a cross sectional view of a connecting structure in accordance with some embodiments of the invention.

FIG. 7 illustrates a cross sectional view of the connecting structure 400 in some embodiments of the invention. The connecting structure 400 may be any of the connecting structures C in FIG. 5. As shown in FIG. 7, a first metal layer 420 is formed on a substrate 410, and then a gate insulating layer 430 is deposited on the substrate 410 and the first metal layer 420. Subsequently, a second metal layer 440 is formed on the gate insulating layer 430, and then a passivation layer 450 is formed on the gate insulating layer 430 and the second metal layer 440. Then, through-holes 460A and 460B are formed in the gate insulating layer 430 and the passivation layer 450 by an etching process, in order to respectively expose the first metal layer 420 and the second metal layer 440. Finally, a conductive layer 470 is formed on the first metal layer 420, the second metal layer 440 and the passivation layer 450, and the conductive layer 470 fills in the through-holes 460A and 460B for electrically connecting the first metal layer 420 and the second metal layer 440 in a bridge manner. The conductive layer 470 may be a transparent conductive layer that includes, for example, indium tin oxide (ITO) or indium zinc oxide (IZO).

In FIG. 7, the substrate 410 corresponds to the lower substrate 111 in FIG. 5, the first metal layer 420 may be formed in the same process as that for forming the gate of each of the TFTs M1-M15 in FIG. 5, the second metal layer 440 may be formed in the same process as that for forming the first source or drain and the second source or drain of each of the TFTs M1-M15 in FIG. 5, the conductive layer 470 may be formed by the same process as that for forming the electrodes of the capacitor Cx in FIG. 4, and the first metal layer 420 and the second metal layer 440 are electrically connected through the conductive layer 470 rather than being directly contacted to each other. The first metal layer 420 and the gate of the thin film transistor TFT in the active area AA may be formed in the same process, and the second metal layer 440 and the source or drain of the thin film transistor TFT in the active area AA may be formed in the same process. In addition, the conductive layer 470 and the pixel electrode or the common electrode in the active area AA may be formed in the same process, i.e., the conductive layer 470 and the pixel electrode or the common electrode in the active area AA may belong to the same layer. In some embodiments, the connecting structures C may be further covered by the sealant 119, so as to further enhance moisture isolation effectiveness.

Moreover, if some of the connecting structures C in FIG. 5 are formed in the formation of the connecting structure 400 illustrated in FIG. 7, the layout diagram of FIG. 5 may further include a transparent conductive wiring (not shown) disposed on the lower substrate 111 and arranged between the edge 111A of the lower substrate 111 and the ground line GL. The transparent conductive wiring (not shown) on the lower substrate 111 is a frame structure and is used for electrostatic discharge prevention to avoid electrostatic surge directly affecting the pixels PX in the active area AA. The transparent conductive wiring (not shown) and the conductive layer 470 of the connecting structure 400 may be formed in the same process.

Figure 8:
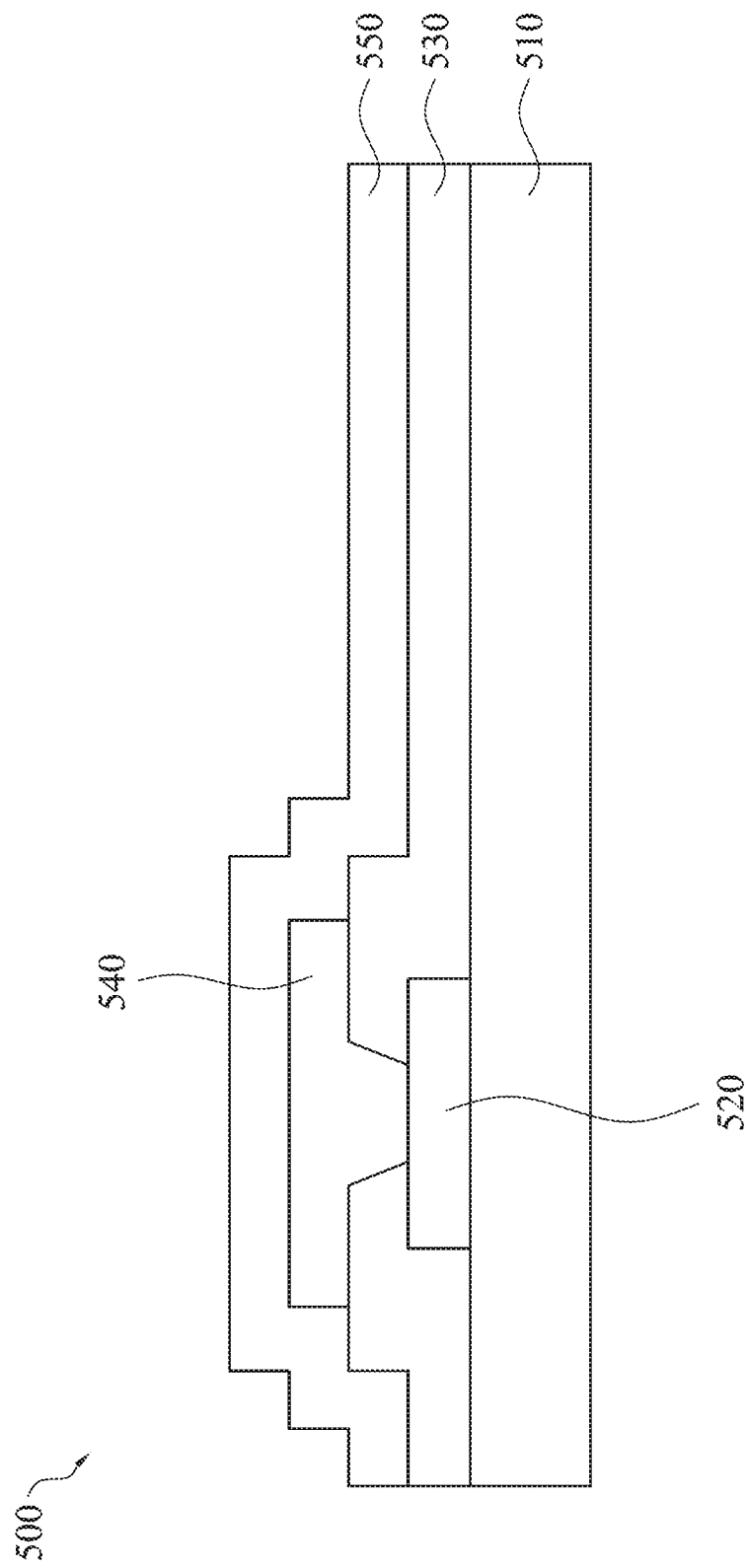
FIG. 8 is a cross sectional view of a connecting structure in accordance with some other embodiments of the invention.

Referring to FIG. 8, FIG. 8 is a cross sectional view of the connecting structure 500 in accordance with other embodiments of the invention. Similarly, the connecting structure 500 may be any of the connecting structures C in FIG. 5. As shown in FIG. 8, a first metal layer 520 is formed on a substrate 510, and then a gate insulating layer 530 is deposited on the substrate 510 and the first metal layer 520. Subsequently, a through-hole is formed in the gate insulating layer 530, and then a second metal layer 540 is formed on the gate insulating layer 530, and the second metal layer 540 directly contacts with the first metal layer via the through-hole. Finally, a passivation layer 550 is formed on the gate insulating layer 530 and the second metal layer 540.

In FIG. 8, the substrate 510 corresponds to the lower substrate 111 in FIG. 5, the first metal layer 520 may be formed in the same process as that for forming the gate of each of the TFTs M1-M15 in FIG. 5, and the second metal layer 540 may be formed in the same process as that for forming the first source or drain and the second source or drain of each of the TFTs M1-M15 in FIG. 5. The second metal layer 540 is covered by the passivation layer 550 for protection from being exposed, and thus the connecting structure 500 can be prevented from being eroded by external moisture.

To sum up, the gate driving circuit of the invention has voltage-level reset function, and elements and wirings for providing the voltage-level reset function are arranged within the shift registers thereof, and therefore the layout area of the gate driving circuit is reduced. A display panel with such gate driving circuit can realize its narrow border requirements.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A gate driving circuit, comprising:
a plurality of shift registers configured to respectively provide a plurality of scan signals to a plurality of gate lines of a display panel; and
a reset signal line that is coupled to the shift registers and is configured to provide a reset signal to the shift registers, wherein the reset signal is used to reset the shift registers after the shift registers respectively output the scan signals;
wherein each of the shift registers comprises:
a precharge circuit that is coupled to a first node and is configured to output a precharge signal through the first node;
a pull-up circuit that is coupled to the first node and a second node, and is configured to output one of the scan signals to a corresponding one of the gate lines through the second node; and a reset circuit coupled to the first node, the second node and the reset signal line, wherein the reset circuit resets voltage levels of the first node and the second node based on the reset signal, and wherein the reset circuit comprises:

a first transistor, wherein a gate of the first transistor is a first portion of the reset signal line, a first source or drain of the first transistor is coupled to a reference voltage level, and a second source or drain of the first transistor is coupled to the first node; and a second transistor, wherein a gate of the second transistor is a second portion of the reset signal line, a first source or drain of the second transistor is coupled to the reference voltage level, and a second source or drain of the second transistor is coupled to the second node;

wherein the reset signal line is disposed between a layout area of the precharge circuit and the reset circuit and a layout area of the pull-up circuit, and wherein a width of the reset signal line is equal to a width of each of the first and second transistors.

2. The gate driving circuit of claim 1, wherein the pull-up circuit comprises:

a third transistor, wherein a gate of the third transistor is coupled to the first node and is configured to receive the precharge signal, a first source or drain of the third transistor is configured to receive a clock signal, and a second source or drain of the third transistor is coupled to the second node and is configured to output one of the scan signals; and a capacitor, wherein a first terminal of the capacitor is coupled to the gate of the third transistor, and a second terminal of the capacitor is coupled to the second source or drain of the third transistor.

3. The gate driving circuit of claim 1, wherein the precharge circuit comprises:

a fourth transistor, wherein a gate of the fourth transistor is configured to receive a first input signal, a first source or drain of the fourth transistor is configured to receive a forward input signal, and a second source or drain of the fourth transistor is coupled to the first node and is configured to output the precharge signal; and a fifth transistor, wherein a gate of the fifth transistor is configured to receive a second input signal, a first source or drain of the fifth transistor is configured to receive a backward input signal, and a second source or drain of the fifth transistor is coupled second source or drain of the fourth transistor.

4. The gate driving circuit of claim 1, wherein each of the shift registers further comprises:

a pull-down circuit coupled to the first node and the second node, wherein the pull-down circuit is configured to receive the precharge signal, a first pull-down control signal and a second pull-down control signal and configured to control whether to pull down one of the scan signals at a reference voltage level and then keep one of the scan signals at the reference voltage level based on the precharge signal, the first pull-down control signal and the second pull-down control signal;

wherein the reset signal line is arranged between the layout area of the precharge circuit and a layout area of the pull-down circuit.

5. The gate driving circuit of claim 4, wherein the pull-down circuit comprises:

a sixth transistor, wherein a gate and a first source or drain of the sixth transistor is configured to input the first pull-down control signal;

a seventh transistor, wherein a gate of the seventh transistor is configured to input the second pull-down control signal, a first source or drain of the seventh transistor is coupled to the reference voltage level, and a second source or drain of the seventh transistor is coupled to a second source or drain of the sixth transistor;

an eighth transistor, wherein a gate of the eighth transistor is coupled to the first node, a first source or drain of the eighth transistor is coupled to the reference voltage level, and a second source or drain of the eighth transistor is coupled to the second source or drain of the sixth transistor;

a ninth transistor, wherein a gate of the ninth transistor is coupled to the second source or drain of the eighth transistor, a first source or drain of the ninth transistor is coupled to the reference voltage level, and a second source or drain of the ninth transistor is coupled to the first node; and a tenth transistor, wherein a gate of the tenth transistor is coupled to the second source or drain of the eighth transistor, a first source or drain of the tenth transistor is coupled to the reference voltage level, and a second source or drain of the tenth transistor is coupled to the second node.

6. A display panel having a display area and a non-display area, the display panel comprising:

a substrate;

a plurality of gate lines and a plurality of data lines disposed on the substrate;

a plurality of shift registers disposed on the substrate and in the non-display area, wherein the shift registers are configured to respectively provide a plurality of scan signals to the gate lines; and a reset signal line disposed on the substrate and in the non-display area, wherein the reset signal line is configured to provide a reset signal to the shift registers, the reset signal is used to reset the shift registers before the shift registers respectively output the scan signals, and the reset signal line crosses a layout area of each of the shift registers;

wherein each of the shift registers comprises:

a precharge circuit coupled to a first node and configured to output a precharge signal through the first node;

a pull-up circuit coupled to the first node and a second node, the pull-up circuit configured to output one of the scan signals to a corresponding one of the gate lines through the second node; and a reset circuit coupled to the first node, the second node and the reset signal line, wherein the reset circuit resets voltage levels of the first node and the second node based on the reset signal, and wherein the reset circuit comprises:

a first transistor, wherein a gate of the first transistor is a first portion of the reset signal line, a first source or drain of the first transistor is coupled to a reference voltage level, and a second source or drain of the first transistor is coupled to the first node; and a second transistor, wherein a gate of the second transistor is a second portion of the reset signal line, a first source or drain of the second transistor is coupled to the reference voltage level, and a second source or drain of the second transistor is coupled to the second node;

wherein the reset signal line is arranged between a layout area of the precharge circuit and the reset circuit and a layout area of the pull-up circuit, and wherein a width of the reset signal line is equal to a width of each of the first and second transistors.

7. The display panel of claim 6, wherein each of the shift registers further comprises:

a pull-down circuit coupled to the first node and the second node, wherein the pull-down circuit is configured to receive the precharge signal, a first pull-down control signal and a second pull-down control signal, and is configured to control whether to pull down the scan signal at a reference voltage level and then keep the scan signal at the reference voltage level based on the precharge signal, the first pull-down control signal and the second pull-down control signal;

wherein the reset signal line is arranged between the layout area of the precharge circuit and a layout area of the pull-down circuit.

\* \* \* \* \*